US006624729B2

United States Patent
Wright et al.

(10) Patent No.: US 6,624,729 B2
(45) Date of Patent: Sep. 23, 2003

(54) SLOTTED GROUND PLANE FOR CONTROLLING THE IMPEDANCE OF HIGH SPEED SIGNALS ON A PRINTED CIRCUIT BOARD

(75) Inventors: Mitchel E. Wright, The Woodlands, TX (US); Joseph Stoddard, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/752,059

(22) Filed: Dec. 29, 2000

(65) Prior Publication Data

US 2002/0084876 A1 Jul. 4, 2002

(51) Int. Cl.[7] ................................................ H01P 3/08
(52) U.S. Cl. ............................................ 333/238; 333/4
(58) Field of Search ........................... 333/238, 246, 333/1, 4

(56) References Cited

U.S. PATENT DOCUMENTS

| 4,587,524 | A |   | 5/1986 | Hall ............................ 343/729 |
| 4,684,953 | A |   | 8/1987 | Hall ............................ 343/725 |
| 5,400,042 | A |   | 3/1995 | Tulintseff .................... 343/727 |
| 5,539,360 | A | * | 7/1996 | Vannatta et al. ............... 333/4 |

FOREIGN PATENT DOCUMENTS

| DE | 2444228 | * | 3/1976 | ................ 333/238 |
| EP | 245890 | * | 11/1987 | ................ 333/246 |
| GB | 2229322 | * | 9/1990 | ................ 333/246 |
| JP | 158002 | * | 7/1991 | ................ 333/246 |
| JP | 5267913 | * | 10/1993 | ................ 333/238 |

OTHER PUBLICATIONS

"Transmission Line with Windowed Ground Plane"; *IBM Technical Disclosure Bulletin*; vol. 33, No. 4; pp 152–153; copy in l333/238, Sep. 1990.*

* cited by examiner

*Primary Examiner*—Benny Lee

(57) ABSTRACT

A circuit in a printed circuit board includes a trace and a ground plane coupled to the trace that includes slots in the vicinity of the trace. The slots are dimensioned and arrayed such that the trace has a controlled impedance. An array of slots progressing in a direction parallel to the trace preferably includes repeating subarrays displaced by a repeat distance in a direction parallel to the trace that is less than a characteristic wavelength of a signal propagated on the trace, coupling distributively with the trace. The slots may be polygonal, arcuate, or a combination of both in shape. The printed circuit board may include a second trace coupled to the first. Further, the printed circuit board may include a second ground plane that includes slots that couple to the trace.

23 Claims, 7 Drawing Sheets

SLOTTED GROUND PLANE FOR CONTROLLING THE IMPEDANCE OF HIGH SPEED SIGNALS ON A PRINTED CIRCUIT BOARD

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to controlling the impedance of a printed circuit board trace. More particularly, the present invention relates to a printed circuit board that has a trace coupled to a slotted ground plane. The slotted ground plane includes slots incorporated in it, such that the impedance of the trace is increased.

2. Background of the Invention

Printed circuit boards are used in computers and other electronic applications to carry signals between electronic components. A printed circuit board typically includes layers of conductive material separated by layers of dielectric material. The conductive material may be a continuous plane or may be etched to remove material and leave, for example, traces for carrying signal. Multi-layer circuit boards typically include dedicated power, ground, and signal layers. Power layers receive outside power and transmit the power to the components. Ground layers provide ground both to components and to traces on signal layers. Signal layers include traces that may carry signal between any of a component, connector, cable, or other device mounted on the circuit board. Traces on different layers may be connected within the circuit board to another layer or to a component using a via. A via is a hole in a printed circuit board that is plated with conductive material. Thus, traces may transmit signals throughout the printed circuit board.

A signal is typically transmitted in the form of a change in voltage with time. The voltage may change from a low value to a high value or from a high value to a low value. Thus, the signal rises or falls. Typically, the time to effect a change in voltage is quantified in terms of the rise time, which is the time to rise from 10% to 90% of the maximum value of the voltage. The rapidness of the rise or fall indicates the transition speed of the signal. The term high speed signal refers to the transition speed, which typically differs from the speed of propagation of the signal, such as along the length of a trace.

A signal may alternately be described in terms of frequency or wavelength. A pulsed signal can be decomposed into a sum of oscillatory waveforms having different frequencies. The spread in frequency is termed the bandwidth of the signal. Conventionally, the bandwidth is about one third of the inverse of the rise time. Although the bandwidth is given in units of frequency, it is typically not the same as a fundamental frequency, for example of a clock, underlying the signal generation. The bandwidth of a signal defines an effective wavelength that is the wavelength of a hypothetical waveform propagating with a frequency equal to the bandwidth. A signal for which the length of the interconnect over which the signal is carried is at least about $1/7$ of the effective wavelength is conventionally termed a high speed signal.

Rise times for many devices, in particular those in consumer electronics, are now sufficiently short, such as 0.5 ns or less, that the rise time of the signal bandwidth is comparable to, or smaller than, the propagation time, the time it takes the signal to propagate the length of the interconnection, including any traces and vias. Therefore, wave effects of the signal are an important design consideration and the trace is treated as part of a high speed transmission line. For example, the transmission line impedance is an important consideration in the design of high speed circuit boards. The impedance determines the correlation between current and voltage. A mismatch in impedance at a location along a transmission line causes part of a signal to be reflected at that location. Depending on the amplitude and timing of the reflection, it may degrade the signal. In particular, it is desirable to reduce the amplitude and persistence of a reflection. Thus, it is the usual practice in high speed circuit board design to control the impedance of the traces so as to enhance the fidelity of signals transmitted through the traces.

Prior trace designs and methods of controlling the impedance of the traces have relied on known formulas or algorithms for the impedance for standard transmission line geometries, such as the microstrip and stripline geometries. A microstrip includes a trace with a rectangular cross-section separated from a solid ground plane by a dielectric material. The impedance of a microstrip increases with increasing height of the trace from the ground plane and decreases with increasing thickness and width of the trace, as well as decreasing with increasing permittivity of the dielectric material. Similarly, a stripline includes a trace with a rectangular cross-section between two parallel solid ground planes, separated from each ground plane by dielectric material. The impedance of a stripline similarly increases with the height from each ground plane and decreases with increasing trace thickness, trace width, and dielectric permittivity. However the specific dependence of the impedance on these parameters differs from that for a microstrip. In similar fashion, relationships are known for other various standard geometries. A designer may consult industry publications or use any of a number of computer programs, either freely available on the internet or distributed commercially.

With the progress of technology towards smaller computers and components, multi-layer printed circuit boards are becoming progressively thinner. In a thinner board, the distance of signal traces from adjacent ground planes must be decreased in order to maintain the same number of layers. Decreasing this distance lowers the impedance in the absence of other changes. One method of countering this affect is to decrease the trace width. However, as trace width decreases, the required tolerance on the width becomes smaller and more difficult to maintain. For trace widths below about 4 mils, it is very difficult to sufficiently control the trace width. Further, with decreasing width, DC resistance and signal attenuation tend to increasingly distort the signal. The above described conventional transmission line designs and methods of controlling impedance have the disadvantage that they fail to maintain a sufficiently high impedance of the trace to match the desired impedance, as multi-layer printed circuit boards become increasingly thin.

A particular difficulty arises in designing for the transmission of signals with different impedance values through different traces on the same layer of a printed circuit board. As computers become smaller and boards become thinner, it is desirable to be able to have the flexibility to use layers that are not dedicated to different values of the impedance. For example, it is desirable to provide a printed circuit board for use as a computer back plane that is able to transmit both logic signals at a base impedance of about 50 Ohms and SCSI signals at an increased impedance of about 100 to about 120 Ohms. The height between the ground plane and the respective traces is the same for signals on the same layer, so the height cannot be varied to vary the impedance of the respective traces. Further, with current limits on trace width, the required 100–120 Ohm impedance cannot be achieved for thin layers with conventional microstrip or stripline geometries and conventional FR4 dielectric material.

Thus, it would be desirable if a system and method were available that provided high speed, high impedance signal transmission in thin multi-layer printed circuit boards.

SUMMARY OF THE INVENTION

The present invention solves the deficiencies of the prior art by providing a configuration for a printed circuit board circuit that incorporates a slotted ground plane.

According to one preferred embodiment, a printed circuit board includes a signal trace for transmitting an electrical signal, and a ground plane coupled to the trace, where the ground plane includes a slot through it in the vicinity of the trace. Further, the slot is coupled to the trace with a distributed inductance. The slot creates an inductive effect that raises the impedance. The printed circuit board may include a second trace coupled to the first trace. Further, the printed circuit board may include a second ground plane having another plurality of slots through it in the vicinity of the trace or traces, where the slot is coupled to the trace, or traces, with a distributed inductance. Preferably, the impedance of each trace is set at a predetermined value. The printed circuit board may further include a second trace substantially uncoupled from the slot, where an impedance of the first trace is set at a predetermined value and an impedance of the second trace is set at a second predetermined value lower than the first value.

According to another preferred embodiment, a printed circuit board includes a conductive layer that includes a transmission line of at least one strip for transmitting an electrical signal having a characteristic wavelength, a dielectric layer adjacent the conductive layer, and a second conductive layer adjacent the dielectric layer. The second conductive layer includes an array of windows through it, the array including at least two substantially identical subarrays. The subarrays are preferably displaced by a repetition distance substantially less than the distance the signal propagates in an amount of time equal to the rise time of the signal. The subarrays may be symmetrically disposed transverse to the transmission line. A subarray may include one window, two windows, or more. Further, the transmission line may include a single conductive strip or a pair of coupled conductive strips. Still further, the printed circuit board may include another dielectric layer adjacent the first conductive layer and yet a third conductive layer adjacent the second dielectric layer, where the third conductive layer includes another array of windows that extends through it. The second array may be an inverse image of the first. Alternatively, the second array may be a mirror image of the first.

According to still another preferred embodiment, a printed circuit board includes a conductive strip and a conductive planar layer coupled to the strip, where the planar layer includes at least two voids through it. The planar layer further includes at least one subplane between the voids, the subplane providing a spacing tangential to said strip. Each of the widths and the length are set at a predetermined value such that the impedance of the trace is set at a predetermined impedance. The circuit board is incorporated in a computer. The voids may have a polygonal shape, such as square or rectangular. Alternatively, the voids may have an arcuate shape, such as circular or ellipsoidal. Still alternatively, the voids may have a combined polygonal and arcuate shape.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections. Likewise, the term "uncouple" or "uncouple" (e.g., the second trace uncoupled from the slot) is intended to mean not coupled, that is an absence of either an indirect or direct electrical connection. The term "computer" is used in this specification broadly and includes a personal computer, workstation, server, or other microprocessor-based device which can be programmed by a user to perform one or more functions and/or operations. Further, the terms "width" and "length" are used is this specification broadly to described geometrical features and are not limited to rectangular features. In particular, the term "width" of a feature indicates the length of the shortest bisecting line across the feature. Similarly, the term "length" of a feature indicates the length of the longest bisecting line across feature. Further, the term "inverse" is used to mean "directly opposite." Thus, first and second arrays that are "inverse images" are opposite in the sense that each window of the first array is opposite a subplane of the conducting layer including the second array, and each window of the second array is opposite a subplan of the conducting layer including the first array. Therefore, the windows of the two arrays are displaced from each other in an opposing fashion so as to form "inverse images." To the extent that any term is not specially defined in this specification, the intent is that the term is to be given its plain and ordinary meaning.

DETAILED DESCRIPTION OF THE PREFERRED EMBODIMENTS

According to a preferred embodiment of the present invention, a printed circuit board includes a ground plane that includes a plurality of inductance-increasing features sized and arrayed to couple with distributed inductance to a trace for carrying a high speed signal. A distributed inductance arises from inductance-increasing features having dimensions smaller than about the characteristic wavelength of the signal. In this case, the whole length of the trace influenced by the inductance-increasing features may be described as one transmission line. This is useful for impedance control, as the impedance of the circuit is substantially uniform along the length of the circuit, reducing reflections, and is primarily determined by the characteristic impedance of the effective transmission line.

For a high speed signal, the capacitance and inductance dominate the equation for the characteristic impedance, $Z_0 = R + j\sqrt{L/C}$, where R is the DC resistance, L is the inductance and C is the capacitance. Hence, the impedance can be increased by increasing the inductance. This has the advantage of allowing thin separations between ground plane and trace to be used, thus allowing thin multilayer printed circuit boards, while still maintaining the impedance at a desired predetermined value.

Although any suitable inductance-increasing feature may be used, a preferred inductance-increasing feature is a slot, also called a window or void, through the ground plane. A slot introduces a local inductance that is related to the dimensions of the slot according to Maxwell's field equations, in particular Ampère's circuital law. Thus, the impedance may be increased by varying the shape and size of a slot and the spacings between multiple slots. It will be appreciated that a slot is preferably introduces a distributed inductance effect and is not a lumped circuit element.

Circuit Configuration

Figure 1:
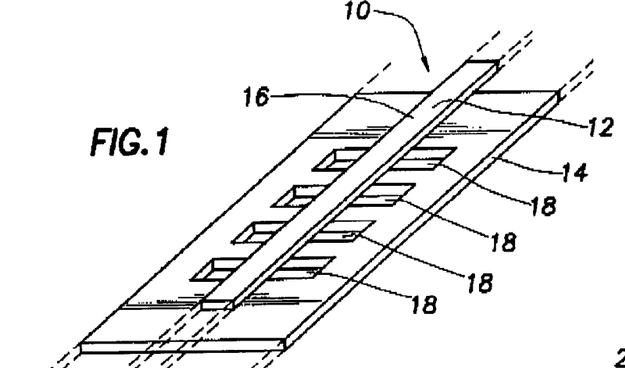
FIG. 1 is a perspective view of a trace and a ground plane according to an embodiment of the present invention.

Referring initially to FIG. 1, according to a preferred embodiment of the present invention, a circuit 10 includes a trace transmission line 12 and a ground plane 14. Transmission line 12 includes at least one trace 16. Ground plane 14 and trace 16 are coupled to each other. Trace 16 is adapted for transmitting an electrical signal, preferably a high speed signal. In particular, the impedance of trace 16 is preferably controlled within a predetermined tolerance. Thus, the impedance of trace 16 is preferably set to a predetermined value. The predetermined impedance will vary with the application for circuit 10. Typically, the characteristic impedance is set to 50 Ohms. Alternately, for circuits incorporated in some computer cards, for example, the characteristic impedance is set to 115 Ohms. It will be appreciated that the tolerance may vary with the application for circuit 10. Typically, an impedance is specified to within ±5%.

Still referring to FIG. 1, ground plane 14 preferably includes a plurality of slots 18 therethrough. Slots 18 add inductance to circuit 10, thereby increasing the impedance. Preferably slots 18 couple to trace 16 with distributed inductance. Circuit 10 may be treated as a transmission line with a characteristic impedance that depends on the dimensions of slots 18 and the spacings between slots 18. Thus, in part by controlling the size and arrangement of slots 18, as described in more detail below, the characteristic impedance may be controlled.

Figure 2:
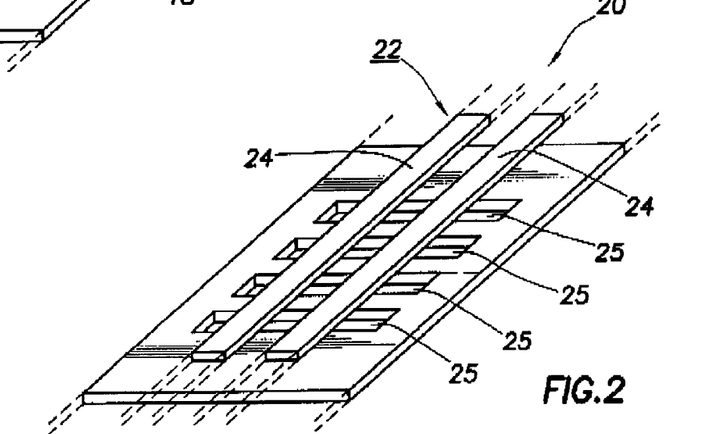
FIG. 2 is a perspective view of a pair of traces and a ground plane according to an alternative embodiment of the present invention.

Referring now to FIG. 2, circuit 20 may includes a transmission line 22 that includes two adjacent traces 24. Adjacent, coupled traces are conventionally used for transmitting a signal in differential mode. Differential signal propagation has the advantage of increasing the signal to noise ratio. In differential mode, the signal is transmitted as a pair of simultaneous signals of opposite polarity, one on each trace 24. As in FIG. 1, a ground plane includes a plurality of slots 25.

Figure 3:
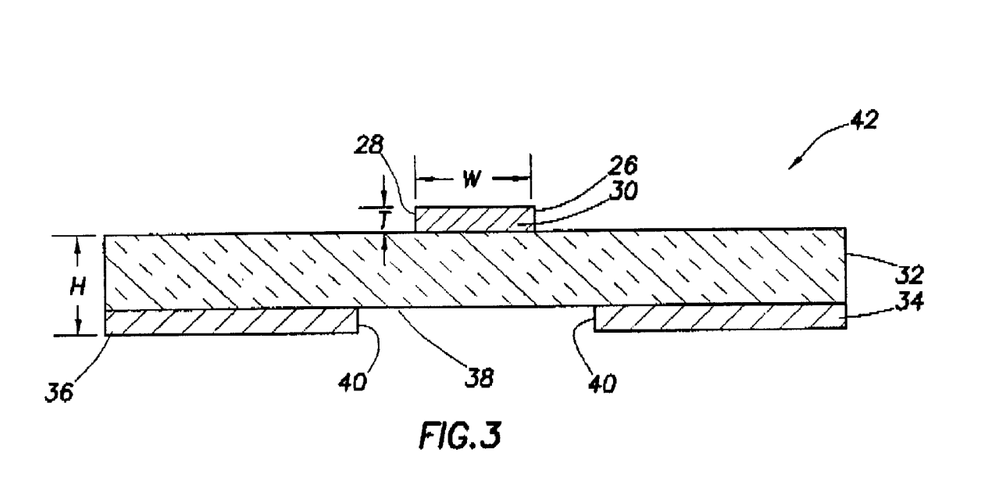
FIG. 3 is a cross-sectional view of conductive and dielectric layers according to an embodiment of the present invention.

Referring now to FIG. 3, a conductive layer 26 preferably includes trace 28. Conductive layer 26 may be formed of a suitable conductive material, such as copper, silver, gold, or the like. Conductive layer 26 includes at least one strip 30 of conductive material forming trace 28. Preferably, trace 28 is a strip of copper from about 0.5 to about 1 mil in thickness. A dielectric layer 32 is adjacent conductive layer 26. Dielectric layer 32 provides electrically insulating material. A conventional dielectric material, such as FR-4, is preferably used. Alternatively, according to the application, exemplary dielectric materials are other FR-4 type materials such as GETEK™ (epoxy/polyphenylene oxide), as well as more high performance materials, such as polyimide, cyanate ester, BT (Beta-triazine), and PTFE (polytretafluoroethylene). Alternatively, dielectric layer 32 may be primarily air. It will be understood that an air dielectric layer does not provide mechanical support for adjacent conductive layers. Thus, if air is used, alternative mechanical support is supplied. A second conductive layer 34 is adjacent the opposite side of dielectric layer 32. Second conductive layer 34 is coupled to ground (not shown). Thus second layer 34 includes ground plane 36. Second layer 34 includes a window 38 therethrough. Surfaces 40, together with adjacent surfaces (not shown) form the perimeter of window 38, defining window 38. Conductive layer 34 may be formed of any suitable conductive material, such as copper, silver, gold, and the like. Preferably, ground plane 36 is a strip of copper from about 0.5 to about 1 mil in thickness. Trace 28 is shown in a microstrip configuration 42. Thus, trace 28 and slotted ground plane 36 form a slotted microstrip circuit.

Figure 4:
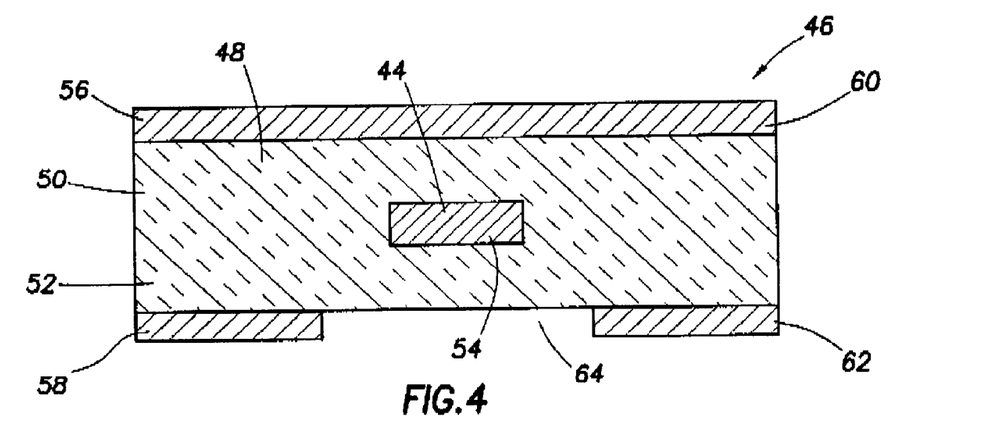
FIG. 4 is a cross-sectional view of conductive and dielectric layers according to an alternative embodiment of the present invention.

Referring now to FIG. 4, trace 44 may alternatively be part of a slotted stripline circuit 46. A dielectric material 48 forms first and second dielectric layers 50, 52 adjacent a conductive strip 54 that forms trace 44 in a first conductive layer. Second and third conductive layers 56, 58 are adjacent first and second dielectric layers, respectively. Each conductive layer 56, 58 is coupled to ground (not shown), forming ground lanes 60, 62. One or both ground planes 60, 62 may include at least one window 64. As shown in FIG. 4, an intact portion of second conductive layer 56 may be disposed over a windowed portion of third conductive layer 58. Thus, conductive layers 56, 58 may each include an array of windows, where the arrays are inverse images of each other.

Figure 5:
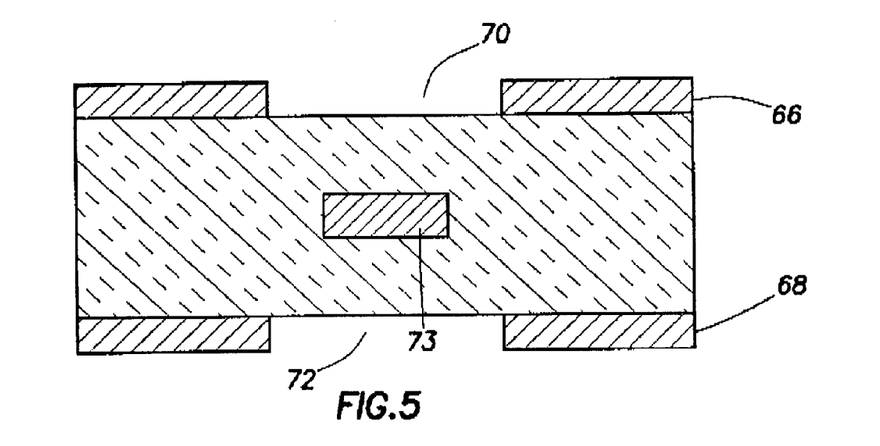
FIG. 5 is a cross-sectional view of conductive and dielectric layers according to still another embodiment of the present invention.

Referring now to FIG. 5, alternatively, conductive layers 66, 68 may each include an array of windows, where the arrays are mirror images of each other. Thus, window 70 is disposed over window 72, in alignment with window 72. Further, windows 70, 72 are located preferably symmetrically with respect to trace 73.

Figure 6:
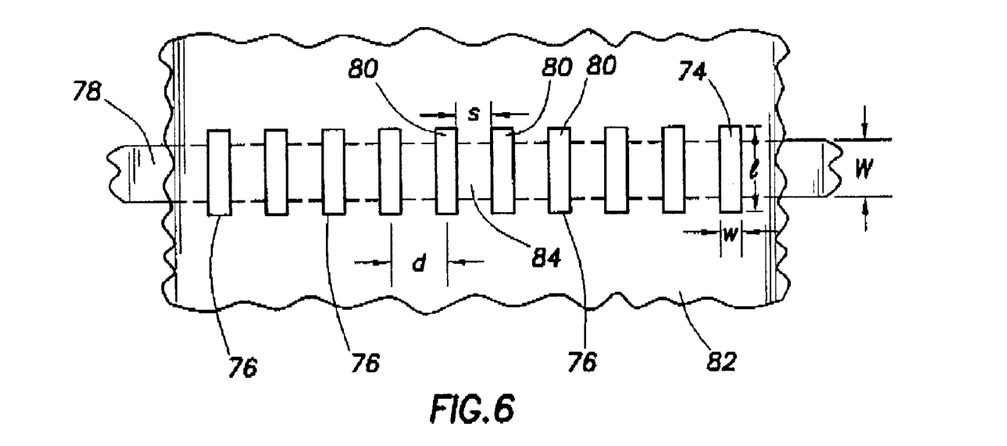
FIG. 6 is a plan view of an array of slots according to an embodiment of the present invention.

Referring now to FIG. 6, an array 74 of slots 76 coupled to a trace 78 includes subarrays 80 displaced by repetition distance d. Trace 78 has width W. Repetition distance d is preferably substantially less than the distance on trace 78 that the signal propagates in a time equal to the rise time. In particular, the repetition distance is preferably sufficiently smaller than the propagation distance or a multiple thereof that the inductance is distributed rather than lumped. Further, repetition distance is preferably sufficiently smaller than the propagation distance or a multiple thereof the parasitic couplings between the slots and trace. For example, and not by way of limitation, for a 1 ns rise time signal with a propagation speed of about 250 ps/in, at least about 10 slots/in are preferred. Each subarray includes at least one slot, or window 76. Windows 76 are preferably substantially identical in shape. Further, each window 76 is preferably centered about trace 78. Thus, the offset of each window 76 is substantially zero and array 74 is substantially symmetric about trace 78. Ground plane 82 includes a subplane 84, which is defined as the space between adjacent subarray 80. Subplane 84 has a width s that is the spacing between edges of adjacent windows 80.

Figure 7:
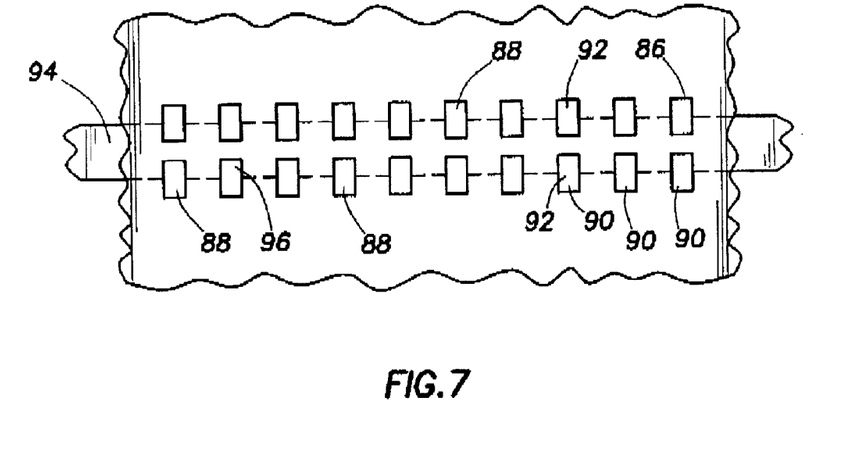
FIG. 7 is a plan view of an alternative array of slots according to an alternative embodiment of the present invention.
Figure 8:
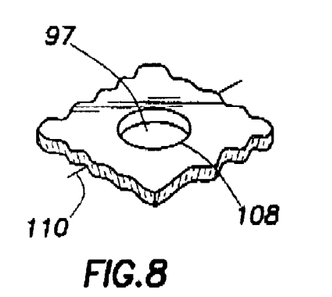
FIG. 8 is a perspective view of a slot having a circular arcuate shape according to another alternative embodiment of the present invention.
Figure 9:
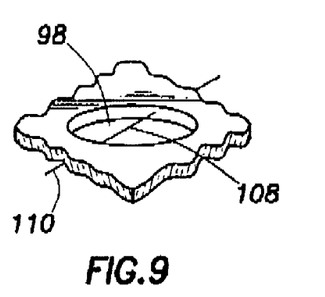
FIG. 9 is a perspective view of a slot having ellipsoidal arcuate shape according to another embodiment of the present invention.
Figure 10:
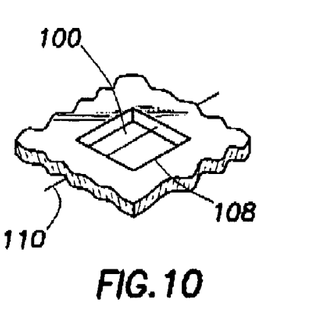
FIG. 10 is a perspective view of a slot having a square polygonal shape according to still another embodiment of the present invention.
Figure 11:
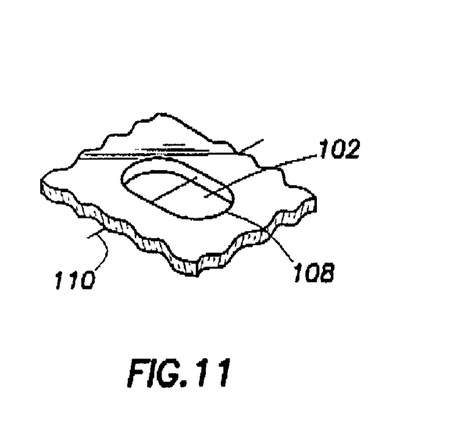
FIG. 11 is a perspective view of a slot having combined arcuate and polygonal shape according to yet another an embodiment of the present invention.

Referring now to FIG. 7, an alternative array 86 of windows 88 includes a plurality of subarrays 90. Each subarray 90 has at least two windows 92. In this case, the windows 92 in a single subarray may differ in shape. However, subarrays 90 are preferably substantially symmetric about trace 94. Further, each subarray 90 is preferably centered about trace 94. Thus, the offset of each subarray 90 is substantially zero. Each window 92 preferably includes a portion 96 under, or overlapping, trace 94.

Although slots are shown as rectangular in FIGS. 1–7, it will be understood that alternative shapes are contemplated.

Figure 12:
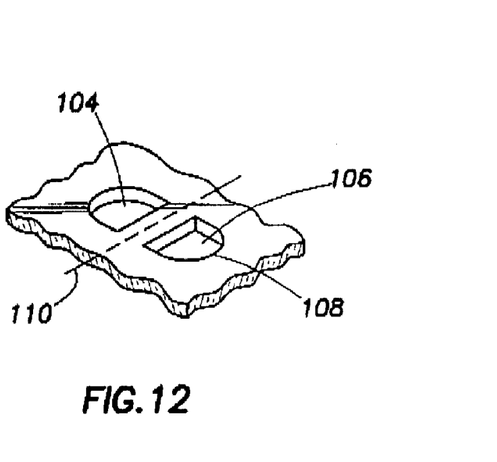
FIG. 12 is a perspective view of a pair of slots having a combined arcuate and polygonal shape according to still yet another embodiment of the present invention.

For example, referring now to FIGS. 8–12, alternative shapes of slots, or voids are shown. In particular, referring to FIGS. 8 and 9, voids 97, 98 may have an arcuate shape, such as the circular shape of void 97, or, more generally, the ellipsoidal shape of void 98, or the like. Alternatively, referring to FIG. 10, a void 100 may have, generally, a polygonal shape, such as the square shape of void 100, or the like. Still alternatively, referring to FIGS. 11 and 12, voids 102, 104, 106 may have a combination of arcuate portions and polygonal portions. Referring to FIGS. 8–12, each subarray 108 is preferably symmetrical about a notional line 110 that parallels a notional line that centers, bisects, or is tangent to a trace or transmission line of traces, such as the lines 112, 114, 116, show in FIGS. 13 and 14. Referring to FIG. 12, a pair of voids 104, 106 in a single subarray 108 are preferably mirror images about notional line 110. Thus subarray 108 is preferably symmetric about line 110.

Figure 13:
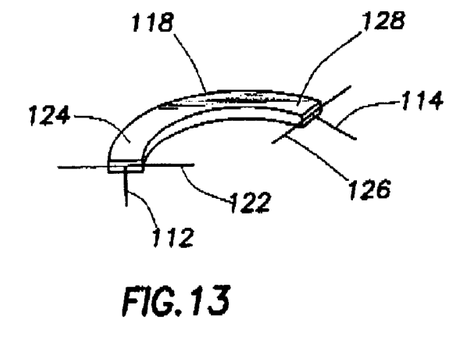
FIG. 13 is a perspective view of a curved trace according to an alternative embodiment of the present invention.
Figure 14:
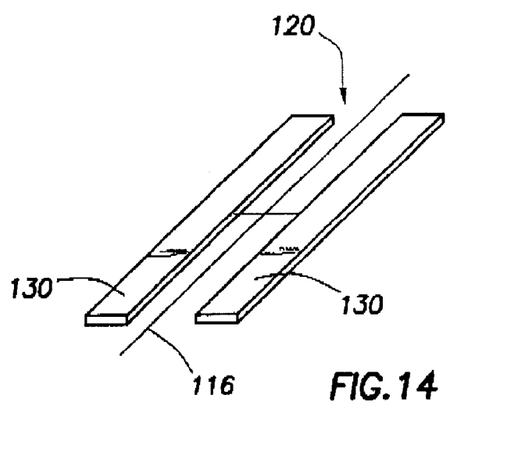
FIG. 14 is a perspective view of a transmission line of a pair of traces according to another embodiment of the present invention.

Referring now to FIGS. 13 and 14, it will be understood that trace transmission lines 118, 120 may have variable shapes and configurations. Referring in particular to FIG. 13, transmission line 118 curves, so that tangent direction 112 and transverse direction 122 at section 124 differ from tangent direction 114 and transverse direction 126 at section 128. Thus, these directions are local properties of transmission line 118. Further, referring in particular to FIG. 14, a notional line 116, is parallel to transmission line 120 and traces 130. Notional line 116 is further equidistant from each transmission line. Referring to both FIGS. 13 and 14 tangent lines 112, 114, and notional line 116 provide lines for the arrangement of slots coupled to traces 130. Although illustrated for a transmission line of two traces, orienting lines and directions may be alternatively used for transmission lines having various numbers of traces. Further, it will be understood that as herein illustrated in FIGS. 1–7, where any single trace is depicted, two or more traces, may alternatively be used, with the two or more traces being centered about a notional line bisecting the length of the illustrated single trace.

Figure 15:
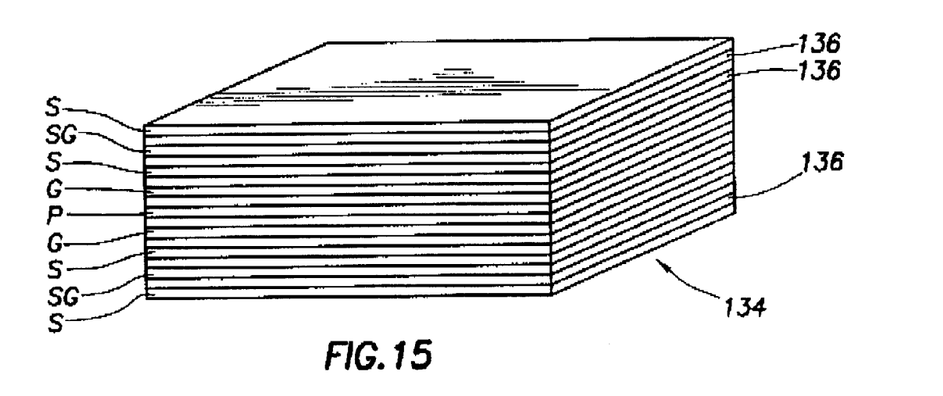
FIG. 15 is a perspective schematic illustration of a printed circuit board according to an embodiment of the present invention.

Referring now to FIG. 15, a multilayer printed circuit board 134 preferably incorporates a ground plane that includes windows, such as those illustrated in FIGS. 1–12. Board 134 preferably includes at least one signal layer S that is a conductive layer including at least one trace. Further, board 134 preferably includes at least one slotted ground plane SG layer that is a conductive layer including at least one slot coupled to a trace as disclosed herein. Still further, board preferably includes at least one power plane P that is a conductive layer for transmitting power. Optionally, board 134 may include at least one conventional, unslotted, ground plane G. Conductive layers are separated by dielectric layers 136. Printed circuit board 134 is preferably assembled in a conventional process of etching traces from laminates, such as copper clad dielectric, and pressing the laminates together with adhesive prepreg layers between the laminate layers. Prepreg layers may form dielectric layers, as is known in the art.

It will be understood that a printed circuit board that includes a slotted ground plane according to an embodiment of the present invention may be a two layer board, or may have any numbers of layers as will be determined by the application.

Figure 16:
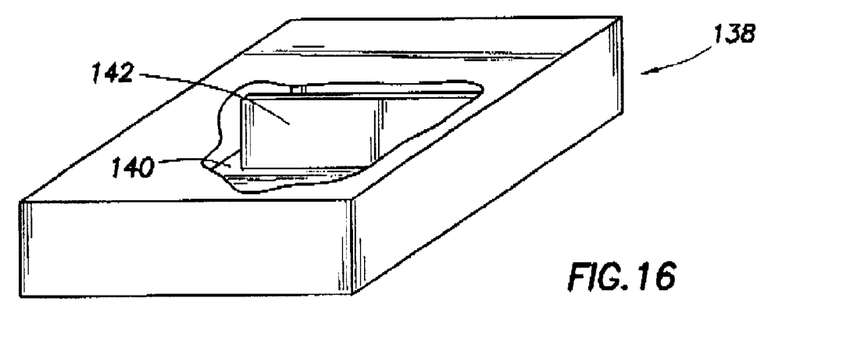
FIG. 16 is a partial cut-away view of a computer according to an embodiment of the present invention.

Referring now to FIG. 16, a printed circuit board that incorporates a slotted ground plane as described herein is preferably a component of a computer 138, such as a back plane 140 or a card 142. In a particularly preferred embodiment, card 142 is a SCSI card. SCSI cards are known in the art and include a SCSI bus. A slotted ground plane incorporated in a SCSI card or a back plane has the advantage of permitting an impedance of 115 Ohms for signal traces to be achieved while still allowing the layers to be closely spaced.

Impedance Control

Referring again to FIG. 6, we have found that the characteristic impedance of trace 78 coupled to ground plane 82 increases with increasing slot length l. In contrast, the characteristic impedance is relatively insensitive to increasing slot width w and spacing s within the preferred upper bound on the repetition distance d. It is preferred that d be substantially less the propagation distance, the distance the signal propagates in a time equal to one rise time.

Referring still to FIG. 7 and again to FIG. 3, it will be appreciated that the impedance of traces 28, 78 depends additionally on conventional geometric parameters. In particular, the impedance decreases with increasing trace width W, decreases with increasing trace thickness T, and increases with increasing height H of trace 28 over ground plane 36. Further, the impedance decreases with increasing dielectric permittivity ∈.

Still referring to FIG. 3, it will be appreciated that the carrier speed v at which a signal is propagated on trace 28 decreases with increasing dielectric permittivity ∈. Thus, if the dielectric material, or materials, of layer 32 between trace 28 and ground plane 36 is chosen for its low ∈, the geometry of trace 28 and slot 38 is preferably adjusted accordingly to maintain the desired impedance of trace 28.

Impedance control is preferably achieved by an interplay between impedance modeling, board layout, and board assembly. Impedance modeling is preferably carried out by simulation of the circuit using a three-dimensional field solver, such as is available from Ansoft. Given the geometrical parameters of a slot, tools are available in computer aided design (CAD) operation to put the geometry of slots as a macro into the layout software. The use of a macro is an advantage in quickly implementing the design, as putting each slot in manually would be undesirably time-consuming. Tolerances on each geometrical parameter are preferably specified for assembly, with the tolerances determined from simulation or from empirical data from test boards.

Thus, a method of controlling impedance preferably includes modeling a circuit having a slotted ground plane, preferably using a program that incorporates field effects. Further, the preferred method includes incorporating the circuit in a design layout; and providing the circuit in assembled printed circuit board. It will be appreciated that steps of modeling, layout, and assembly may occur in any order, and may be iterated to achieve to desired controlled impedance.

Void Shape

Figure 17:
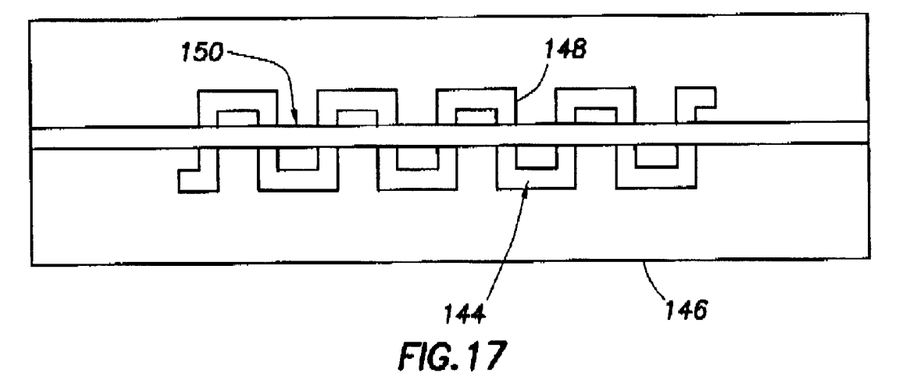
FIG. 17 is a plan view of an extended void according to an embodiment of the present invention.
Figure 18:
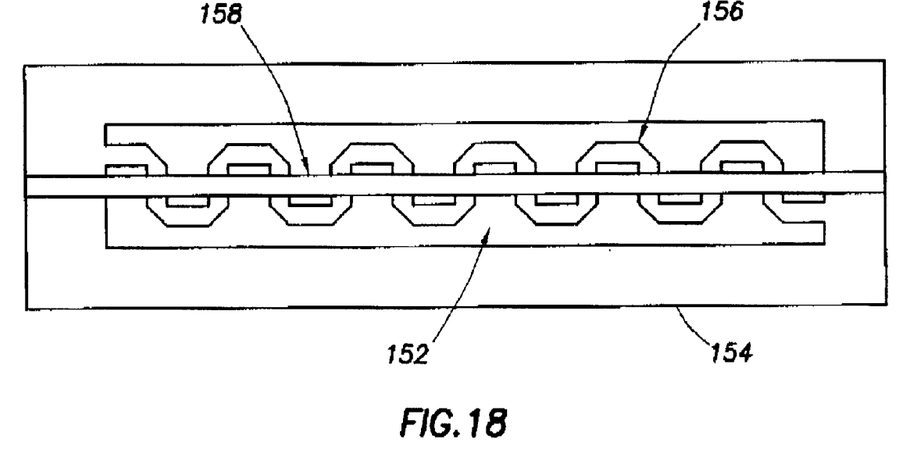
FIG. 18 is a plan view of an alternative extended void according to an alternative embodiment of the present invention.

Referring to FIGS. 17 and 18, it will be understood that voids that may extend the length of a trace are contemplated. In particular, referring to FIG. 17, a void 144 may extend the length of a ground plane 146, having connected subvoids 148 that criss-cross, preferably symmetrically, a line parallel to a signal trace 150. Alternately, referring to FIG. 18, a void 152 may be shaped so that a ground plane 154 includes a return trace 156 disposed within the void, the return trace criss-crossing, preferably symmetrically, a notional line parallel to a signal trace 158. In such configurations as depicted in FIGS. 17 and 18, the repetition distance d is the distance between crossings of the notional line parallel to the trace.

EXAMPLE 1

Figure 19:
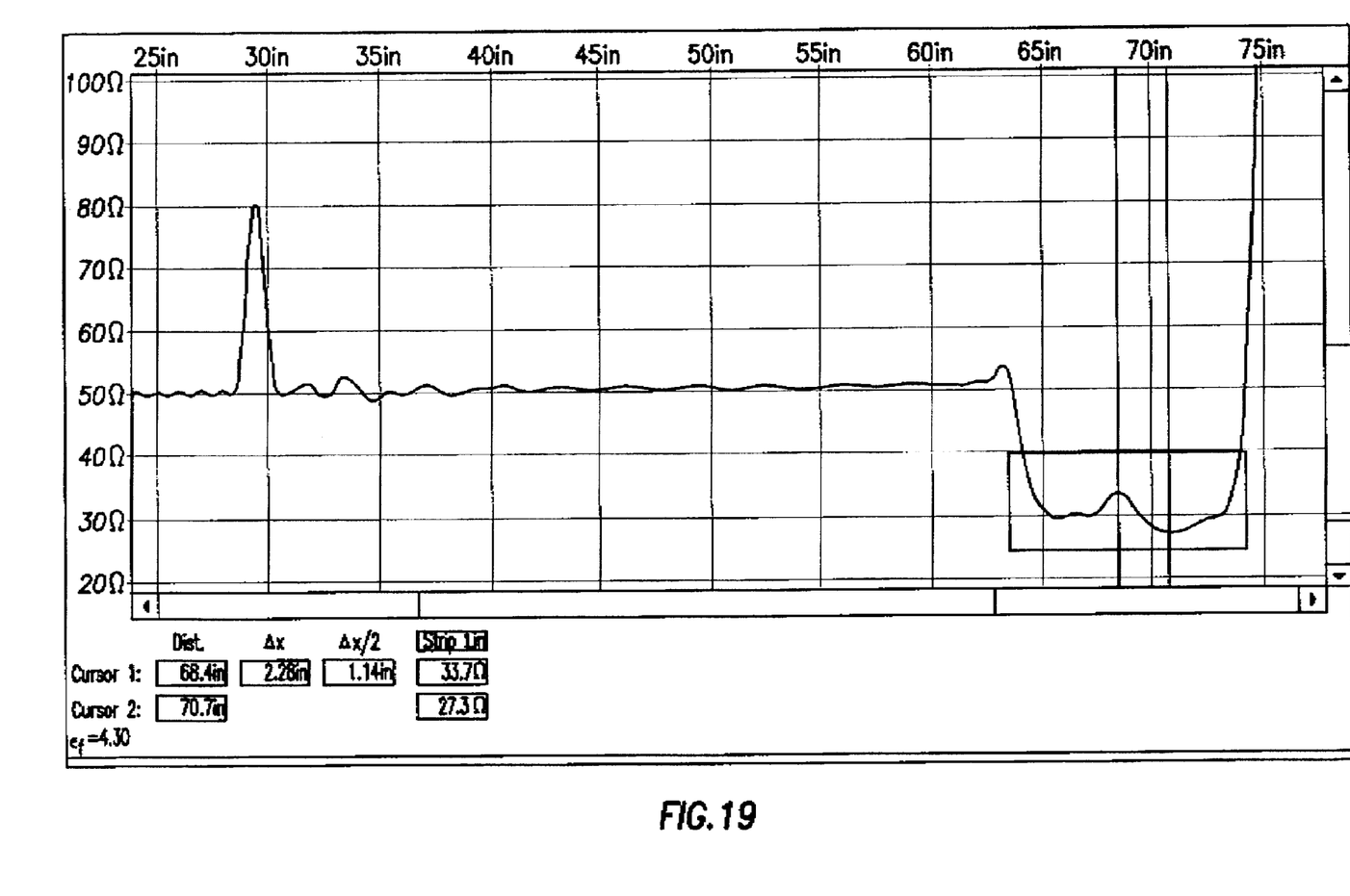
FIG. 19 is a graph of an impedance profile according to an exemplary embodiment of the present invention.
Figure 20:
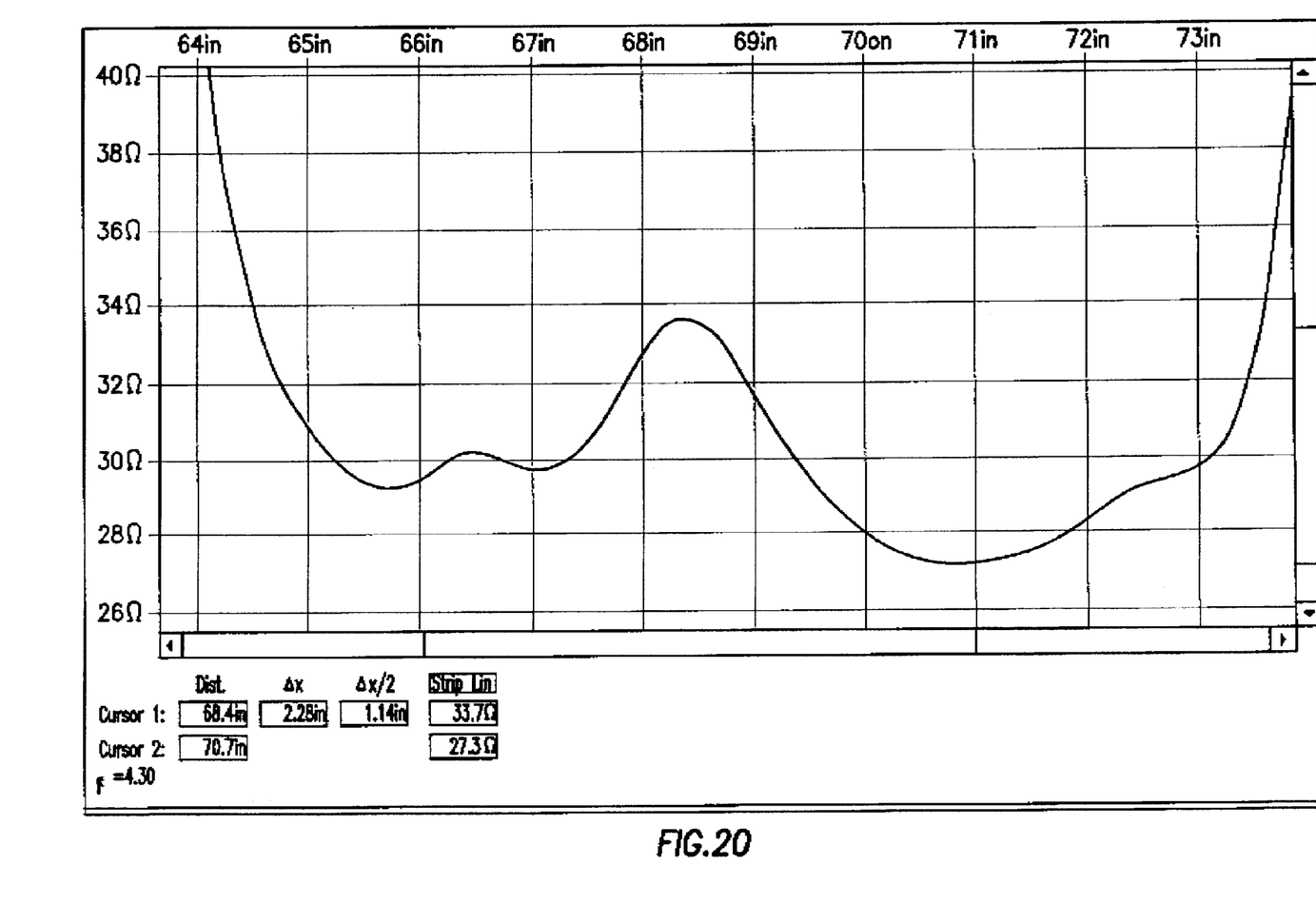
FIG. 20 is an expanded view of a portion of the graph in FIG. 19.

A sheet of laminate was used to model a two sided printed circuit board. The sheet included an FR4 dielectric layer with a thickness of about 29 mils and copper cladding of about 1.4 mils thickness, for a total thickness of about 1/32 in. Parallel channels were cut into one of the copper layers, forming a trace 0.125 in. wide. 8 rectangular slots were cut from a portion of the opposite copper layer, centered under the trace, starting about 2.5 inches from an edge of the laminate and extending to 3 inches from the same laminate edge. Each slot was about 0.250 in. long and about 0.005 in. wide. Edges of adjacent slots were spaced by about 0.0625 in. Thus, the repetition distance of the slots was about 0.0630 in. A piece of coaxial cable was soldered to the circuit to provide a mechanism of signal injection. A TDR machine (time domain reflectometer machine) was used to send a signal pulse along the circuit. The reflected pulse was detected and analyzed using a conventional software package to obtain an impedance profile. Impedance measurements are shown in FIG. 19 and a portion of the waveform from FIG. 19, between 64 in. and 74 in. as indicated by the box in FIG. 19, is shown magnified in FIG. 20. FIG. 20 shows an increase a minimum impedance from about 27 Ohms in the slotted region to a maximum of about 34 Ohms in the region containing the slots. This represents about a 25% increase in impedance due to the slots.

EXAMPLE 2

An electric field solving program was used to simulate the design of a slotted stripline transmission line. 2 mil wide and 6 mil long slots spaced at 4 mil for a repetition distance of 6 mil were used above and below a 5 mil wide and 1.4 mil thick trace. Thus the ground planes were mirror images. Each slot was symmetrically oriented about the trace, that is the offset of each slot was zero. The heights from the trace to each ground plane were each 5 mil. A dielectric permittivity of 4.3 was used. The trace length was 250 mils. An impedance value of 45 Ohms was obtained. For comparison, a simple stripline with no slots and otherwise the same geometric and dielectric permitivity of 500 mils length was simulated, obtaining an impedance value of 41 Ohms. Thus, the impedance was increased about 10% by the slots.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A printed circuit board comprising:
    a conductive strip for transmitting an electrical signal;
    a conductive planar layer coupled to said strip, comprising:
        at least two voids therethrough, each void having substantially the same length transverse to said strip and substantially the same width tangential to said strip, each void centered about said strip; and
        at least one subplane between said voids, said subplane providing a spacing tangential to said strip;
    wherein each of said width, said spacing, and said length are set at a predetermined value such that the impedance of said trace is set at a predetermined impedance;
    wherein said signal has a rise time and said spacing is substantially less than the distance said signal propagates in a time equal to said rise time; and
    wherein said circuit board is incorporated in a computer.

2. The printed circuit board according to claim 1 wherein at least one of said voids is a polygonal shape.

3. The printed circuit board according to claim 2 wherein each said shape is rectangular.

4. The printed circuit board according to claim 2 wherein each said shape is square.

5. A printed circuit board, comprising:
a trace for transmitting an electrical signal having a rise time;
a first ground plane coupled to said trace, said first ground plane comprising:
a first plurality of slots therethrough in the vicinity of said trace; and
a second ground plane coupled to said trace, said second ground plane comprising:
a second plurality of slots therethrough in the vicinity of said trace;
wherein each of said first plurality of slots is coupled to said trace with a distributed inductance and said first plurality of slots are spaced by a first repetition distance parallel to said trace and substantially less than the distance said signal propagates in a time equal to said rise time; and
wherein each of said second plurality of slots is coupled to said trace with a second distributed inductance and said second plurality of slots are spaced by a second repetition distance parallel to said trace and substantially less than the distance said signal propagates in a time equal to said rise time.

6. The printed circuit board according to claim 5 wherein an impedance of said trace is set at a predetermined value.

7. The printed circuit board according to claim 5 further comprising:
a second signal trace coupled to said trace and coupled to said first and second plurality of slots;
wherein said signal is transmitted in differential mode.

8. The printed circuit board according to claim 7 wherein an impedance of said trace and said second trace is set at a predetermined value.

9. A printed circuit board, comprising:
a first trace for transmitting an electrical signal;
a ground plane coupled to said trace, said ground plane comprising:
a slot therethrough in the vicinity of said trace; and
a second trace substantially uncoupled from said slot;
wherein said slot is coupled to said first trace with a distributed inductance; and
wherein an impedance of said first trace is set at a predetermined value and an impedance of said second trace is set at a second predetermined value lower than said first value.

10. A printed circuit board comprising:
a conductive strip;
a conductive planar layer coupled to said strip, comprising:
at least two voids therethrough, each void having substantially the same length transverse to said strip and substantially the same width tangential to said strip; and
at least one subplane between said voids, said subplane providing a spacing tangential to said strip;
wherein each of said width, said spacing, and said length are set at a predetermined value such that the impedance of said trace is set at a predetermined impedance; and
wherein said circuit board is incorporated in a computer; and
wherein at least one of said voids has a combined polygonal and arcuate shape.

11. A printed circuit board, comprising:
a first conductive layer comprising:
a transmission line containing at least one strip for transmitting an electrical signal;
a dielectric layer adjacent said first layer;
a second conductive layer adjacent said dielectric layer, said second conductive layer comprising:
an array of windows therethrough, said array comprising at least two substantially identical subarrays;
wherein said signal has a rise time and said subarrays are displaced by a repetition distance parallel to said transmission line and substantially less than the distance said signal propagates in a time equal to said rise time.

12. The printed circuit board according to claim 11 wherein each said subarray is symmetrically disposed in a direction substantially transverse to said transmission line.

13. The printed circuit board according to claim 11 wherein each said subarray comprises at least one of said windows.

14. The printed circuit board according to claim 11 wherein each said subarray comprises at least two of said windows.

15. The printed circuit board according to claim 11 wherein said transmission line comprises a single strip.

16. The printed circuit board according to claim 11 wherein said transmission line comprises a pair of coupled strips.

17. The printed circuit board according to claim 11 wherein said printed circuit board is incorporated in a computer.

18. A printed circuit board, comprising:
a first conductive layer comprising:
a transmission line containing at least one strip for transmitting an electrical signal having a rise time;
a dielectric layer adjacent said first layer;
a second conductive layer adjacent said dielectric layer, said second conductive layer comprising:
a first array of windows therethrough, said first array comprising at least two substantially identical subarrays spaced by a first distance parallel to said at least one strip and substantially less than the distance said signal propagates in a time equal to said rise time;
a second dielectric layer adjacent said first conductive layer; and
a third conductive layer adjacent said second dielectric layer, said third conductive layer comprising a second array of windows therethrough, said second array comprising at least two substantially identical subarrays spaced by a second distance parallel to said at least one strip and substantially less than the distance said signal propagates in a time equal to said rise time.

19. The printed circuit board according to claim 18 wherein said first and second arrays are mirror images of each other.

20. The printed circuit board according to claim 18 wherein said first and second arrays are inverse images of each other.

21. A printed circuit board comprising:
a conductive strip;
a conductive planar layer coupled to said strip, comprising:
at least two voids therethrough, each void having substantially the same length transverse to said strip and substantially the same width tangential to said strip; and at least one subplane between said voids, said subplane providing a spacing tangential to said strip;

wherein each of said width, said spacing, and said length are set at a predetermined value such that the impedance of said trace is set at a predetermined impedance; and wherein said circuit board is incorporated in a computer; and wherein at least one of said voids is an arcuate shape.

22. The printed circuit board according to claim 21 wherein said shape is ellipsoidal.

23. The printed circuit board according to claim 22 wherein said shape is circular.

* * * * *